United States Patent [19]

Nelson

[11] 4,412,241
[45] Oct. 25, 1983

[54] MULTIPLE TRIM STRUCTURE

[75] Inventor: Carl T. Nelson, Sunnyvale, Calif.

[73] Assignee: National Semiconductor Corporation, Santa Clara, Calif.

[21] Appl. No.: 209,248

[22] Filed: Nov. 21, 1980

[51] Int. Cl.³ .................. H01L 27/02; G05F 3/00; G05F 5/00; G05F 7/00

[52] U.S. Cl. ................... 357/51; 323/354; 307/303

[58] Field of Search .......... 357/51; 323/354, 74; 307/303

[56] References Cited

U.S. PATENT DOCUMENTS 4,016,483  4/1977  Rudin .................. 357/51
4,210,996  7/1980  Amemiya et al. ............ 357/51

*Primary Examiner*—Andrew J. James
*Assistant Examiner*—Seth Nehrbass
*Attorney, Agent, or Firm*—Gail W. Woodward; Paul J. Winters; Michael J. Pollock

[57] ABSTRACT

A trim structure having a nominal resistance value can be adjusted to have a higher or lower value by a combination of fuse blowing and zener zapping. In the preferred embodiment a pair of integrated circuit pads are employed in a trim structure along with a pair of back-to-back zener diodes, a fuse link, and four resistors. In its initial state, with both diodes and the fuse link intact, a particular or nominal resistance value is available. Blowing the fuse link alone produces a second or highest resistance value. Shorting, or zapping, one zener diode produces a third higher than nominal but lower than highest resistance value. Shorting, or zapping, the other zener diode produces a fourth, lower than nominal, resistance value. Shorting, or zapping, both zener diodes produces a fifth lowest resistance value. Thus, five different resistance values are available using only two integrated circuit pads. If desired, the five resistance steps can be made linear by properly selecting the resistor values. In addition, one of the circuit pads can be a common power supply terminal so that only one pad need be added to the integrated circuit chip. Two or more such structures can be fabricated with a common pad by the addition of one additional pad for each such structure.

10 Claims, 7 Drawing Figures

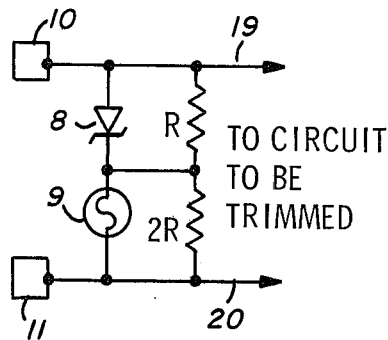
Fig_1
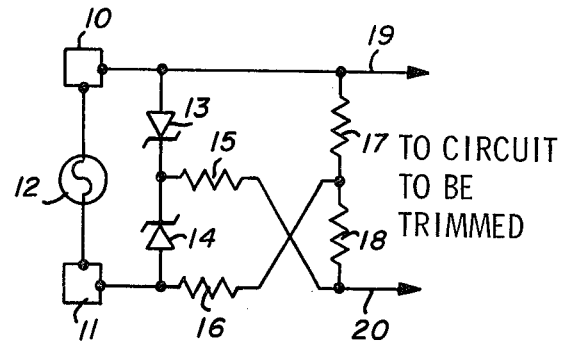
Fig_2
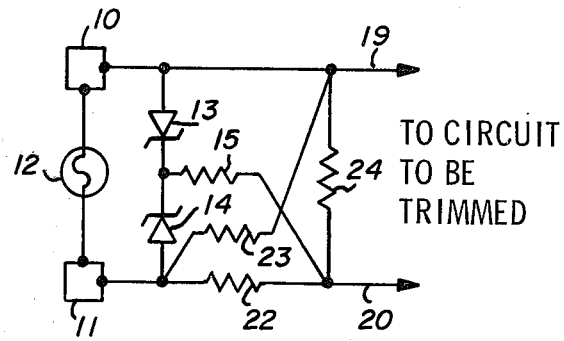
Fig_3
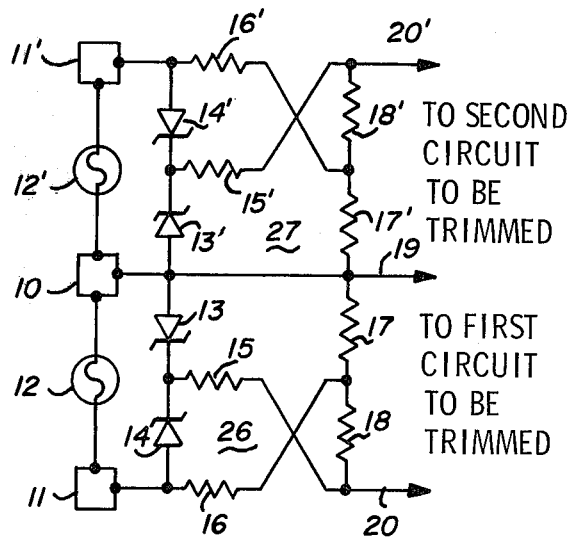
Fig_4

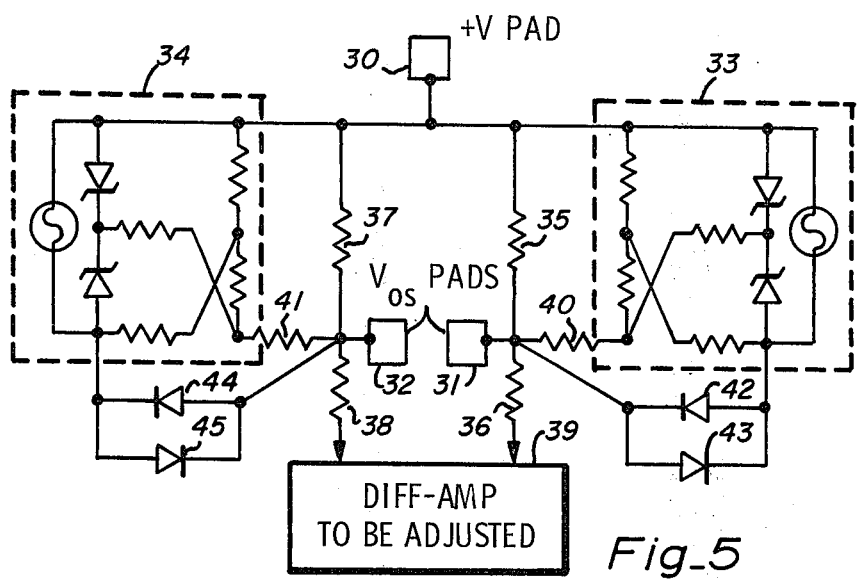
Fig_5
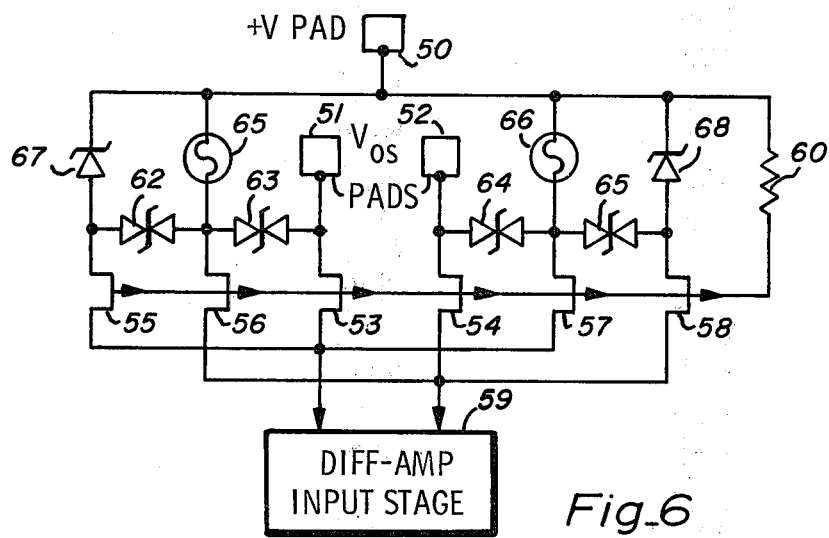
Fig_6
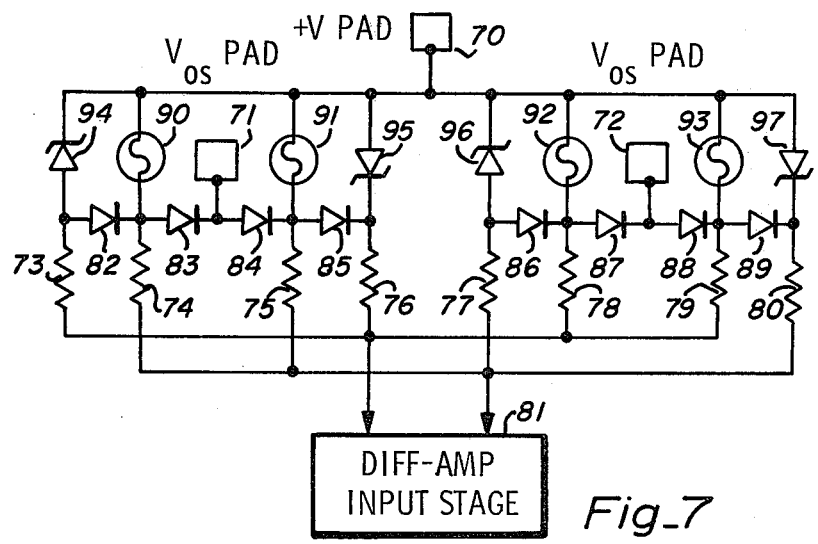
Fig_7

MULTIPLE TRIM STRUCTURE

BACKGROUND OF THE INVENTION

The invention relates broadly to the trimming of monolithic semiconductor integrated circuit (IC) devices using the so-called zener zap approach. In U.S. Pat. No. 4,225,878 to Robert C. Dobkin, and assigned to the assignee of the present invention, a back-to-back zene diode configuration is disclosed. In my copending application Ser. No. 186,797 filed Sept. 12, 1980, and titled BILATERAL ZENER TRIM, an improved back-to-back zener diode structure is disclosed. Basically, a string of series resistors is connected to zener diodes so that each resistor has a parallel diode. When a particular diode is zapped, or shorted out, the associated resistor is shorted out and the string value reduced by that amount. By using back-to-back diodes, the number of IC chip pads is reduced and the zapping is determined by the polarity of the pulse as well as the pads being used. My above-identified application relates to a structure in which the forward biased diode in the pair is protected. It is intended that the protected structure be employed in practicing the present invention.

Clearly, in prior art zener zapping, the starting trim resistance is maximum and is reduced in steps as each diode is zapped. It would be desirable to start with a nominal mid-range resistance value with trimming acting to either raise or lower this value.

SUMMARY OF THE INVENTION

It is an object of the invention to provide an IC trimming structure in which a nominal value exists initially and the trimming can either raise or lower the nominal value.

It is a further object of the invention to provide a simple IC trim structure having a nominal value along with multiple higher and lower values.

It is a still further object of the invention to provide an IC trim structure that produces a plurality of resistance steps and uses only a single pair of IC pads to adjust the steps.

It is a still further object of the invention to provide an IC trim structure having a plurality of equal value steps using a pair of chip pads wherein a combination of fuse blowing and zener zapping operates to achieve the steps.

These and other objects are achieved with the following structure. In its broadest form resistors are coupled between a pair of IC chip pads and a parallel fuse link and zener diode connected to the resistors. The original or nominal resistance value can either be raised or lowered by a combination of zener zapping and fuse blowing. In a preferred embodiment, a pair of IC chip pads have connected therebetween a fuse element and a pair of back-to-back zener diodes. A resistor wye (or delta) has two of its legs connected to the pads and a fourth resistor is connected from the third leg to the common zener diode terminal. The combination provides a nominal resistance value between the first and third legs. The resistance can be altered by blowing the fuse and selectively zapping the two zener diodes thus giving five resistance states. By properly selecting the resistor values, the five different resistance values can be linearly related.

If desired, a plurality of such structures can be combined for trimming an IC. If the nominal or starting resistance values are ratioed, a coarse-fine trim can be achieved. Where two such structures are combined they can share a common line with one of the power supply terminal pads. Thus, by adding only two pads to an IC, along with the appropriate parts, a circuit can be coarse-fine trimmed to provide a 25 to 1 improvement in the accuracy of the trimmed parameter.

BRIEF DESCRIPTION OF THE DRAWING

FIG. 1 is a schematic diagram of the basic structure of the invention.

FIG. 2 is a schematic diagram of the preferred structure of the invention.

FIG. 3 is a schematic diagram of an alternative embodiment of the structure of FIG. 2.

FIG. 4 is a schematic diagram of an embodiment of the invention using a pair of structures of the FIG. 2 variety combined to have a common IC pad.

FIG. 5 is an alternative embodiment of the invention using a pair of FIG. 2 structures along with the existing pads of an IC for post assembly trimming.

FIG. 6 is an alternative of the invention for use with a FET input IC and post assembly trimming.

FIG. 7 is an alternative embodiment of the invention using existing trim pads to trim the input stage currents in a completed IC after assembly.

DESCRIPTION OF THE INVENTION

FIG. 1 illustrates the basic concept of the invention. IC chip pads 10 and 11 are coupled to the circuit to be trimmed which could be a portion of a resistor network that is to be trimmed. With the circuit as shown, intact fuse link 9 shorts out resistor 2R so that the overall resistance is R. It is only necessary that the operating voltage across resistor R be less than a few hundred millivolts so that diode 8 will not be conductive in its forward direction. For the reverse diode bias condition it is only necessary that the zener voltage not be exceeded. If the current rating of fuse link 9 exceeds the zener zapping current on diode 8 and a zener zapping current is passed between pads 10 and 11, it will flow through diode 8 which will short out, thus lowering the overall resistance close to zero. After the zener diode is shorted, a fuse blowing current can be passed between pads 10 and 11. This will raise the resistance between pads 10 and 11 to a value of 2R. Thus the original or nominal resistance value of R can selectively be raised to 2R or lowered to zero. As an alternative to the foregoing an additional resistance level can be achieved. If it is found that a high resistance value is needed for trimming, fuse element 9 can be blown first thereby achieving a 3R value between pads 10 and 11. In the event this is done, no further trimming will be done. In this alternative it is only necessary that diode 8, when forward biased, can carry enough current to blow fuse 9. In this instance the protective structure employed in my copending application Ser. No. 186,797 filed Sept. 12, 1980, would be particularly desirable.

In FIG. 2, IC chip pads 10 and 11 are shown coupled to a fuse link 12 and back-to-back zener diodes 13 and 14. Fuse link 12 can be of the conventional well known IC variety using either aluminum metalization or deposited combinations of other materials. Diodes 13 and 14 can be in a common structure as shown in my above-identified patent application Ser. No. 186,797 filed Sept. 12, 1980. While not shown, it is to be understood that pads 10 and 11 can be probe contacted and a current pulse applied for programming. For example, if a current pulse is applied having a voltage maximum less than the zener diode breakdown voltage (typically about 7 volts), the fuse link 12 can be selectively blown. Then, if a typically 30-volt pulse limited to about one ampere is applied, diodes 13 and 14 can be selectively zapped depending upon the pulse polarity. Since zener zap trimming and fuse link blowing are well known in the prior art, they will not be further detailed herein.

Resistors 15–18 will provide different resistance values between lines 19 and 20 which are connected to the circuit to be trimmed.

In its original state where fuse link 12 is intact and shorts pads 10 and 11 together, it can be seen that resistor 18 is in series with the parallel combination of resistors 16 and 17. The following table shows the resistance formulas as a function of the trimming state conditions.

TABLE 1

| Trim Condition | | | | Formula for Terminal 19–20 Resistance* |
|---|---|---|---|---|
| Link 12 | Diode 13 | Diode 14 | State | |
| intact | intact | intact | $R_{out1}$ | $\frac{R_{16} R_{17}}{R_{16} + R_{17}} + R_{18}$ |
| open | intact | intact | $R_{out2}$ | $R_{17} + R_{18}$ |
| open | shorted | intact | $R_{out3}$ | $\frac{R_{15}(R_{17} + R_{18})}{R_{15} + R_{17} + R_{18}}$ |
| open | intact | shorted | $R_{out4}$ | $R_{17} + \frac{R_{18}(R_{15} + R_{16})}{R_{18} + R_{15} + R_{16}}$ |
| open | shorted | shorted | $R_{out5}$ | $\frac{R_{15}\left(R_{18} + \frac{R_{17} R_{16}}{R_{17} + R_{16}}\right)}{R_{15} + R_{18} + \frac{R_{17} R_{16}}{R_{17} + R_{16}}}$ |

*Where the various R numbers refer to the resistors of FIG. 1.

A linear relation for the five states of table 1 would be where:

$$(R_{out3} - R_{out5}) = (R_{out1} - R_{out3}) = (R_{out4} - R_{out1}) = (R_{out2} - R_{out4})$$

If the above equations are solved simultaneously in terms of $R_{out1}$, it is found that:

$R_{out2} = 1.268 R_{out1}$
$R_{out3} = 0.866 R_{out1}$
$R_{out4} = 1.134 R_{out1}$
and $R_{out5} = 0.732 R_{out1}$ Note that there are two steps above $R_{out1}$ and two below. Completing the solution for the resistors of FIG. 1 yields:

$R_{17} = R_{16} = 0.536 R_{out1}$
$R_{18} = 0.732 R_{out1}$
$R_{15} = 2.732 R_{out1}$ In FIG 2 it can be seen that resistors 16–18 form a wye-connected combination. If desired, a wye-delta conversion can be made to produce the structure of FIG 3. Here, resistors 22–24 represents the conversion results of resistors 16–18 of FIG. 1. Since such a conversion is a standard manipulation, it will not be detailed further.

FIG. 4 shows how two structures of the FIG. 2 configuration can be combined. The bottom half 26 is a reproduction of FIG. 2. The top half 27 is a mirror image thereof so that both halves share a common line 19 from pad 10. The elements of the top half have been given prime sign designations and will be dealt with in the same manner. In a typical application, pad 10 will be a common terminal for a power supply line 19. Terminals 20 and 20' will be connected to two circuits that are to be trimmed independently.

FIG. 4 provides an additional application for the invention in which a coarse-fine trim is available. Since the structure has a five-state capability, one of the structures is made to have a nominal, or $R_{out1}$, value of one-fifth of the resistance of other structure.

In a typical application example, the circuit of FIG. 4 could be used to offset trim a differential amplifier. Pad 10 is a power supply line and lines 20 and 20' will be connected to the two sides of the differential trim structure. Assuming that the IC can be manufactured to an untrimmed offset voltage of ±2.5 mV, the coarse trim could reduce this to ±0.5 mV, and the fine trim would further reduce the offset to ±100 microvolts.

In another example, the coarse-fine trim is employed on a voltage regulator intended to provide a particular output level. If the IC process is capable of manufacturing to ±5% of nominal, the output level could be trimmed to within ±0.2%.

The FIG. 4 structure can be implemented on an IC chip by the mere addition of two pads. Thus, the improvements in performance cited above requires very little chip area and will carry a very small area penalty in IC design. The trimming is carried out at the wafer probing operation in the fabrication process. Here, probes are applied sequentially to the individual circuit chips and the circuits tested. At the same time, probes are coupled to the trimming pads and the circuit under test trimmed to a desired performance level. This means that when the chips are separated from the wafer and individually packaged, their final performance will be within much tighter limits than would be the case for ordinary IC fabrication.

While not shown, additional trim structures could be added in accordance with the FIG. 4 showing. That is, where FIG. 4 shows two trim structures, three or more could be used. In this case, the additional trimming could be used for increasing circuit performance by simply extending the above concepts. Also, additional circuit elements could be trimmed to improve other performance parameters of the IC.

Thus far the trim structure shown is intended for use at the wafer fabrication level and can be accomplished during the wafer probing step. It has been determined that in some devices a circuit will shift its operating point during chip mounting. This means that in wafer form a circuit could be operating within specification. However, after assembly a shift may occur and possibly result in out of specification operation. Accordingly it would be desirable, in some cases to perform the trim after assembly. FIG. 5 shows one means for an after assembly trim using the bonding pads that are employed in the IC normally.

Pad 30 represents the normally used power supply connection, for example the +V pad. Pads 31 and 32 are the normally used offset trim pads. Normally a potentiometer will be connected to these three pads for an offset adjustment. These pads are connected to the appropriate pins in the assembled structure.

The circuits shown inside the dashed outlines 33 and 34 are of the kind shown in FIG. 2. Each one includes a resistor network, a fuse link, and back-to-back trim diodes as described above. Resistors 35 and 36 couple pad 30 to one side of a differential amplifier (diff-amp)

39 while resistors 37 and 38 couple pad 30 to the other side of diff-amp 39.

Resistor 40 couples circuit 33 to pad 31 and resistor 41 couples circuit 34 to pad 32. Back to back parallel diodes 42 and 43 couple circuit 33 to pad 31 while back to back parallel diodes 44 and 45 couple circuit 34 to pad 32 as shown. Diodes 42-45 are made large enough so that they will be undamaged by the trimming of circuits 33 and 34. Thus diodes 42-45 will act to couple a trimming pulse to the respective circuits yet in normal circuit operation will act as open circuits to low operating bias voltages (on the order of a few hundred millivolts).

In operation, after the IC is packaged, circuit 33 can be adjusted by connecting a pulse source to the package pins that are bonded to pads 30 and 31. An initial current pulse of limited voltage can be used to selectively blow the fuse while a higher voltage pulse can be used to selectively zap the zener diodes, as a function of polarity, to thereby create a five-level resistance value as described for FIG. 2. Then using the pins bonded to pads 30 and 32 in the same way a second five-level resistance value can be achieved for the other half of the circuit. Even after the above described trims are accomplished, pads 30-32 can still be used with a potentiometer for a final precision trim if desired.

FIG. 6 shows an alternative multiple trim structure suitable for use with a field effect transistor (FET) input IC. For such devices U.S. Pat. No. 4,050,030 discloses a typical circuit. The completed IC includes pads 50, 51, and 52 which provide the connections to power supply and offset pins respectively. Normally a potentiometer will be connected to these pins for offset voltage trimming. In the circuit of FIG. 5 FET's 53 and 54 represent the conventional offset balance devices which are coupled to input stage 59 where they operate in the normal manner. FET's 55 through 58 represent small geometry devices that can be permanently added to provide a post construction offset balance trim.

The gate electrodes of FET's 53 through 58 are all returned to +V at pad 50 through resistor 60 to prevent high current surges through the gate/source junction during trimming. Since the FET's 53 through 58 may operate with up to 5 volts between gate and source electrodes, they must be isolated with diodes having a breakdown voltage greater than 5 volts. Back to back series zener pairs 62 through 65 satisfy this requirement. These devices are made large enough to be unaffected by the zapping pulses to be applied in trimming.

FET's 56 and 57 are nominally added to the circuit by way of fuses 65 and 66 respectively. Either of these FET devices can be removed by selectively blowing the associated fuse. Zener diodes 67 and 68 when nominally back biased below their breakdown voltage will permit the associated FET source electrode to float thereby pinching the FET off. If either zener 67 or 68 is zapped, the associated FET 55 or 58 will be added to the circuit. Using the IC pins connected to pads 50 and 51 a current pulse limited to a predetermined voltage can be employed to selectively blow fuse 65. A higher voltage pulse can then selectively zap zener diode 67. Similarly by applying pulsing to the IC pins connected to pads 50 and 52 fuse 68 and zener diode 68 can be selectively blown and zapped. Thus a choice of removing either FET's 56 and 57 is available along with the subsequent addition of FET's 55 and 58. This will allow a 5 to 1 trim improvement over the as manufactured condition.

FIG. 7 shows another post construction IC diff-amp trim configuration. Here the positive power line pad 70 and offset trim pads 71 and 72 are employed to selectively couple resistors 73 through 80 to input stage 81. Diodes 82 through 89 act to isolate the disconnected resistors from the rest of the circuit. These diodes are robust enough to withstand the trimming currents.

Fuse elements 90 through 93 act nominally to couple resistors 74, 75, 78, and 79, respectively, directly to the +V line. Zener diodes 94 through 97 couple resistors 73, 76, 77, and 80, respectively, to the +V line. If pads 70 and 71 are coupled to a current pulse source with the positive terminal to pad 71 diodes 84 and 85 are conductive and a low voltage current pulse is used to blow fuse 91. A subsequent high voltage pulse will zap zener diode 95. Thus resistor 75 can be removed and if desired resistor 76 added. Using the opposite polarity of pulse can then be used to selectively blow fuse 90 and then zap zener diode 94 so as to remove resistor 74 from the circuit and then, if desired, add resistor 73.

Pads 70 and 72 permit the same kind of treatment for the right hand portion of the circuit in which resistors 78 and 79 are nominally present. Thus after resistor 78 is removed resistor 77 can be added and after resistor 79 is removed, resistor 80 can be added. This arrangement provides a 13:1 improvement in the trimmed offset parameter.

The invention has been described and its application detailed. When a person skilled in the art reads the above, equivalents and alternatives within the spirit and intent of the invention will be apparent. Accordingly, it is intended that the scope of the invention be limited only by the following claims.

I claim:

1. A multiple trim structure for use in semiconductor integrated circuits and having a nominal output resistance value wherein a trimming operation can either raise or lower said nominal output value, said structure comprising:
   a plurality of bonding pads;
   a network of resistance elements coupled between a pair of said bonding pads, said network presenting an output resistance value that can be varied by trimming;
   a combination of zener diode means and fuse element means coupled between said pair of bonding pads and to said network of resistance elements whereby selected ones of said resistance elements can be invoked;
   means for coupling current pulses to said pair of bonding pads whereby a selected fuse element can be blown so as to remove a short circuit across a portion of said network thereby raising said output resistance; and
   means for coupling current pulses to said pair of bonding pads whereby a selected zener diode can be zapped so as to add a short circuit across a portion of said network thereby lowering said output resistance.

2. The structure of claim 1 wherein a pair of bonding pads has first and second resistors coupled in series therebetween, said first resistor is coupled in parallel with a fuse element, and said second resistor is coupled in parallel with a zener diode.

3. The structure of claim 1 wherein said bonding pads are located on said integrated circuit and are available for trimming said circuit in semiconductor wafer form.

4. The structure of claim 1 wherein said bonding pads are accessible through connections to the pins of a completed integrated circuit package for trimming said circuit after assembly.

5. A trimmable resistance structure for use in semicondutor integrated circuit devices having a plurality of bonding pads, said structure comprising:
   first and second bonding pads;
   a fuse link connected between said first and second pads;
   first and second zener diodes coupled in back-to-back series configuration between said first and second pads;
   first, second, and third resistors coupled together in a three terminal network configuration, the first terminal of which is coupled to said first pad and the second terminal of which is coupled to said second pad; and
   a fourth resistor having one end coupled to the common connection between said first and second zener diodes and the other end coupled to the third terminal of said three terminal network whereby the resistance between said second and third terminals of said network can be either raised or lowered by a combination of fuse link blowing and zener diode shorting.

6. The structure of claim 5 wherein said first, second, and third resistors form a wye network.

7. The structure of claim 5 wherein said first, second, and third resistors form a delta network.

8. The structure of claim 5 wherein said first, second, third, and fourth resistor values are selected to produce linear increments of resistance as a function of said fuse link blowing and zener diode shorting.

9. The structure of claim 5 further comprising:
   a third bonding pad;
   third and fourth zener diodes coupled in back-to-back series configuration between said second and third pads; and
   fifth, sixth, seventh and eighth resistors coupled together to form a mirror image of the first, second, third, and fourth resistors whereby two independently trimmable resistance structures having a common pad are formed.

10. The structure of claim 9 wherein said first, second, and third bonding pads are available at the pins in the finished packaged integrated circuit.

* * * * *